(12) United States Patent
Martin et al.

(10) Patent No.: US 8,459,334 B2
(45) Date of Patent: Jun. 11, 2013

(54) CONTAINMENT FOR A PATTERNED METAL THERMAL INTERFACE

(75) Inventors: Yves C. Martin, Yorktown Heights, NY (US); Theodore G. Van Kessel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 985 days.

(21) Appl. No.: 12/533,587

(22) Filed: Jul. 31, 2009

(65) Prior Publication Data

US 2011/0024099 A1    Feb. 3, 2011

(51) Int. Cl.
  *F28F 7/00*  (2006.01)
(52) U.S. Cl.
  USPC ............................. 165/79; 165/185
(58) Field of Classification Search
  USPC .................................. 165/79, 185
  See application file for complete search history.

(56) References Cited

U.S. PATENT DOCUMENTS

| | | | |
|---|---|---|---|
| 4,684,506 A | 8/1987 | Hahan | |
| 4,685,606 A | 8/1987 | Flint | |
| 5,365,402 A * | 11/1994 | Hatada et al. | 361/699 |
| 5,370,178 A | 12/1994 | Agonafer et al. | |
| 5,572,404 A | 11/1996 | Layton | |
| 6,166,907 A | 12/2000 | Chien | |
| 6,665,186 B1 * | 12/2003 | Calmidi et al. | 361/704 |
| 6,865,077 B2 | 3/2005 | Igarashi | |
| 7,063,127 B2 * | 6/2006 | Gelorme et al. | 165/80.2 |
| 7,160,758 B2 | 1/2007 | Fitzgerald | |
| 7,219,713 B2 * | 5/2007 | Gelorme et al. | 165/80.4 |
| 7,282,799 B2 | 10/2007 | Brunschwiler | |
| 7,312,987 B1 | 12/2007 | Konshak | |
| 7,551,656 B2 * | 6/2009 | Bennett et al. | 372/34 |
| 2008/0137300 A1 | 6/2008 | Macris | |
| 2008/0165502 A1 | 7/2008 | Furman | |
| 2009/0122491 A1 | 5/2009 | Martin | |

FOREIGN PATENT DOCUMENTS

| | | | |
|---|---|---|---|
| JP | 2006302223 A2 | 11/2006 | |
| JP | 2006-12744 A2 | 12/2006 | |

* cited by examiner

*Primary Examiner* — Teresa Walberg
(74) *Attorney, Agent, or Firm* — Michael J. Buchenhorner; Vazken Alexanian

(57) ABSTRACT

A system and method to improve long term reliability of an integrated circuit package containing a patterned metal thermal interface (PMTI), the method including: coupling a heat sink to a heat source; providing a PMTI material between the heat source and the heat sink; providing a partial containment of a compressed malleable metal to impede the PMTI from being inched-out of its location under a bearing load.

19 Claims, 4 Drawing Sheets

Embossed Heat-sink (or heat-spreader lid)

Heat-sink + PMTI + Copper foil sliding on lubricated surface of semiconductor processor

Containment ring cross-section

Embossed Heat-sink (or heat-spreader lid)

CONTAINMENT FOR A PATTERNED METAL THERMAL INTERFACE

CROSS-REFERENCE TO RELATED APPLICATIONS

None.

STATEMENT REGARDING FEDERALLY SPONSORED-RESEARCH OR DEVELOPMENT

None.

INCORPORATION BY REFERENCE OF MATERIAL SUBMITTED ON A COMPACT DISC

None.

FIELD OF THE INVENTION

The invention disclosed broadly relates to the field of heat sinks, and more particularly relates to the field of the use of a containment device for limiting leakage from an integrated circuit package.

BACKGROUND OF THE INVENTION

The evolution towards higher power microprocessor and memory semiconductors has driven interest in highly conductive metal thermal interface materials (MTI) to provide the thermal connection between chip and heat sink.

Metal interfaces perform well as direct interfaces (between a semiconductor processor and heat-sink), or as indirect interfaces (between a semiconductor processor and a lid, or heat-spreader cap or plate, or between such a lid or cap or plate and a heat-sink). For good and reliable performance however, patterned metal thermal interfaces must be kept under compression, with a compressive pressure of the order of 100 psi (pounds per square inch). Presently, many high performance computer processor packages readily provide this level of compressive load, often in the range of 100 to 300 psi, and in some cases, as high as 1,000 psi.

The benefit of a high compressive load appears evident during short term testing of the PMTI: the larger the compressive load, the better the thermal conduction through the thermal interface. Stress testing of the computer package, however, brings out a weakness of the PMTI in the form of a degradation that can occur at a later date in the product life. Specifically, it occurs under intense thermal cycling, where the temperature is varied between room temperature and a higher operating temperature over many cycles that simulate many power-on and power-off operations of the computer.

PMTI is still a very new technology that is just being introduced into the computer industry. Its high thermal conductivity, ease of manufacturing and rework, make it very valuable as a key component of the cooling package of high power processor chips. It is also essential that it performs reliably over the life-time of the computer.

We have identified a potential failure mechanism that occurs after extended operation, and particularly as the results of temperature transients, that occur for example during power on or off operations. When the temperature changes, materials expand or contract due to thermal expansion. A copper heat-sink will expand by several tens of microns during a power-on operation. By contrast, a silicon chip will only expand by a few microns. The compliance of the malleable metal that comprises the PMTI is key to maintaining a good and reliable thermal bond between a copper heat-sink and a silicon chip, despite this non-uniform motion.

Over many such differential motion cycles however, some of the PMTI material is slowly squeezed out of the interfacial narrow volume between the heat-sink and chip. The squeezing out occurs as an inchworm-like motion under repeated temperature cycles. It occurs in a non-uniform manner: the motion is slow at the center of the chip, but is larger near the perimeter of the chip. Consequently, the interface first degrades at the periphery of the chip, as the result of a slight thinning of the PMTI material at these locations. Over time however, the PMTI can be squeezed out to such a level that the thermal bond substantially degrades over a large portion of the chip area.

Several solutions have been explored, which have yielded various levels of success. One of these, optimization of the compressive load, reduces the compressive load and slows down the squeeze-out motion of the PMTI. However, the overall performance and reliability also is diminished.

Another solution is using stiffer PMTI materials, like Tin or an Indium-tin alloy. Here the squeeze out motion is reduced, but so is the overall thermal bond, because of the more limited compressibility of the material.

Patterning the interfacial surfaces (heat-sink or chip): patterning the heat-sink can help anchor the PMTI material and slow the inchworm motion. However, the main effect of the patterned surface is to allow a more uniform bond between the PMTI and the surface, by providing many delocalized points of contact between the malleable metal and the surface. In another application, the patterned structure actually facilitates the squeezing out of the material, so as to minimize its thickness. This is generally desirable since the thermal bond often improves with decreasing interface thickness. However, beyond a minimum thickness level, the thermal bond then degrades, especially for the case of a PMTI.

Therefore, a need still exists for a solution to the above shortcomings.

SUMMARY OF THE INVENTION

Briefly, according to an embodiment of the invention, a method to improve reliability of a thermal coupling between a heat source and a heat sink includes steps or acts of: providing a malleable conducting material between a first substantially flat surface of the heat source and a first substantially flat surface of the heat sink; providing a partial containment of a compressed malleable material to prevent the material from inching-out (squeeze-out) of its location under high load; and coupling the first substantially flat surface of the heat sink to the first substantially flat surface of the heat source. The substantially flat surface of the heat sink is optionally a patterned metal wherein the metal surface is patterned with channels to further impede inch-out of the compressed material.

According to another embodiment of the present invention, a cooling assembly includes: a heat sink with one substantially flat surface; a malleable conducting material disposed between the one substantially flat surface (i.e., deviating from a perfectly flat by amounts not considered substantial by those skilled in the art) of the heat sink and a substantially flat surface of a heat source; a partial containment of the malleable conducting material to impede the malleable conducting material from being inched-out of its location under a compressive load.

BRIEF DESCRIPTION OF THE DRAWINGS

To describe the foregoing and other exemplary purposes, aspects, and advantages, we use the following detailed description of an exemplary embodiment of the invention with reference to the drawings, in which.

Figure 1:
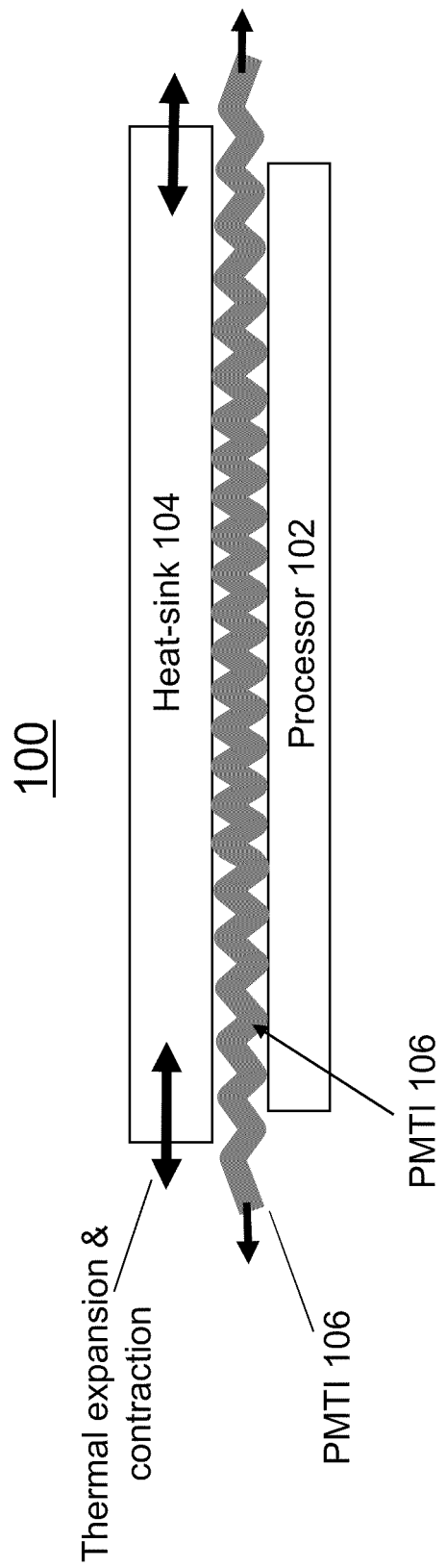
FIG. 1 shows a cross section of a typical optionally lidded processor chip with electrical and thermal packaging.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

In the following description, numerous specific details are set forth by way of exemplary embodiments in order to provide a more thorough description of the present invention. It will be apparent, however, to one skilled in the art, that the present invention may be practiced without these specific details. In other instances, well-known features have not been described in detail so as not to obscure the invention. Unless specifically noted, it is intended that the words and phrases in the specification and claims be given the ordinary and accustomed meaning as understood by those of skill in the applicable art. If any other meaning is intended, the specification will specifically state that a special meaning is being applied to a word or phrase.

We disclose a method to improve the long term reliability of a patterned metal thermal interface. Specifically, we provide containment of the compressed malleable metal which prevents the malleable metal from inch-out of its location under high load. FIG. 1 shows a cross section of a typical optionally lidded processor chip 102 with electrical and thermal packaging. The processor 102 is coupled to a heat-sink 104 and a patterned metal thermal interface (PMTI) 106 is disposed between the processor 102 and the heat-sink 104. FIG. 1 shows the non-uniform inch-out of the PMTI, with the greater inch-out occurring along the perimeter of the processor 102.

Figure 2:
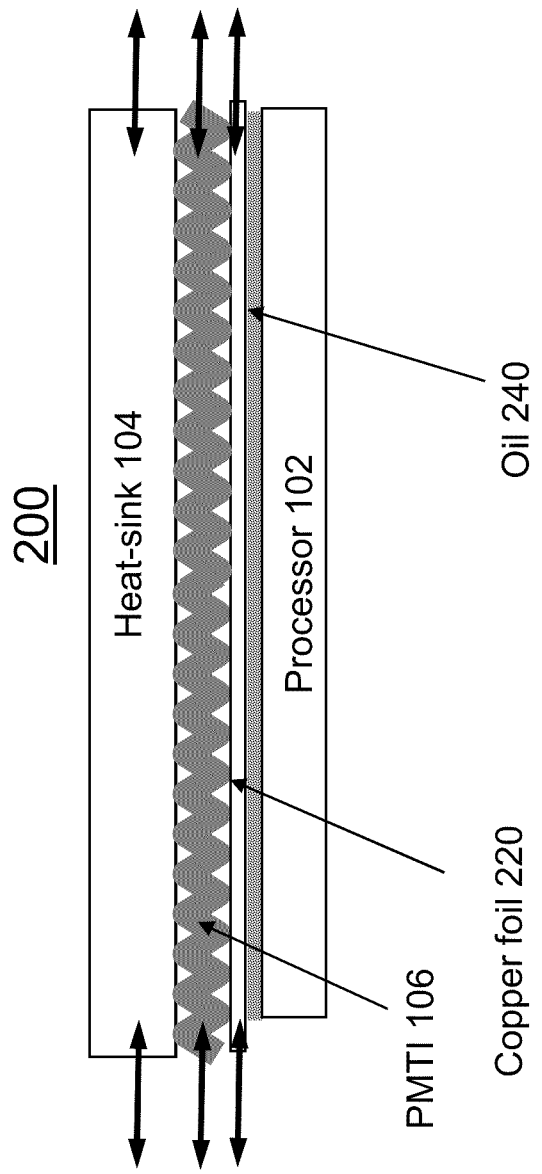
FIG. 2 shows a Heat-sink with a PMTI and Copper foil sliding on lubricated surface of a semiconductor processor.

Referring to FIG. 2, there is shown a cross-section of an integrated circuit package 200 with a heat-sink 104 with PMTI 106 and Copper foil 220 sliding on a lubricated surface of a semiconductor processor. We disclose a supplemental insert between the heat sink 104 and the processor chip 102. We have chosen a 25 micron copper foil 220 for the core of the supplemental insert and oil 204 for the organic layer (and no wetting layer). The oil 240 is disposed between the supplemental copper foil 220 and the processor chip 102, and acts as a lubricated interface. It should be noted that in this discussion we use the terms "processor," "semiconductor," and "chip" interchangeably to refer to a heat source.

The three item assembly comprising the heat-sink 104 plus the PMTI 106 plus a supplemental copper foil 220 can be regarded as a fairly homogenous assembly, as shown in FIG. 2. As the temperature rises and falls, the three items expand and contract fairly uniformly, because the two external items 104 and 220 are formed from the same material (copper), are at substantially the same temperature, and are joined by a fairly malleable material 106. On the other hand, the semiconductor processor 102 expands very little during the temperature swings. Therefore, the three items 104, 106, and 220, are made to ride on the very flat surface of the semiconductor processor 102 via a thin oil film 240. The items are expanding and contracting with a sliding motion on the surface of the semiconductor 102. This minimizes the inchworm motion of the patterned indium 106 relative to its two copper sides 104 and 220, and therefore the squeezing out and thinning of the indium material 106.

The conducting material 106 can be any material such as, but not limited to: Indium, Tin, bismuth, antimony, Thallium, Gallium, Silver, Gold, Platinum, Lead, Aluminum, Titanium, Tantalum, Tungsten, Chromium, Nickel, wax, and oil. The conducting material 106 preferably is patterned with channels to evenly distribute the malleable material 106 under a compressive load.

Figure 3:
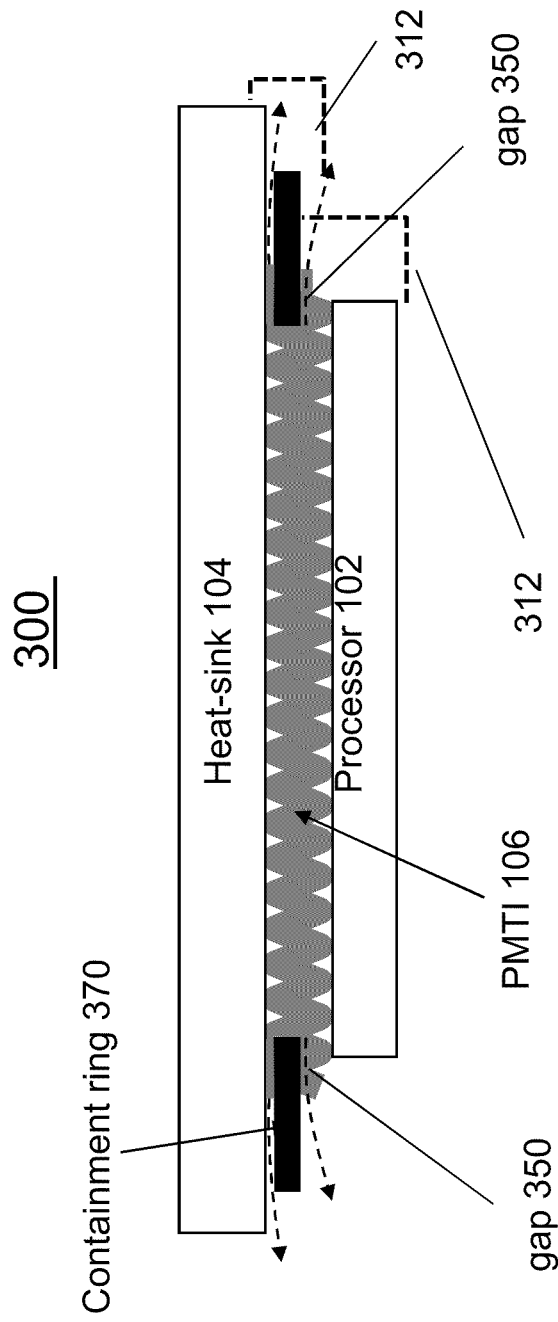
FIG. 3 shows a containment ring disposed in an integrated circuit package according to an embodiment of the invention.
Figure 4:
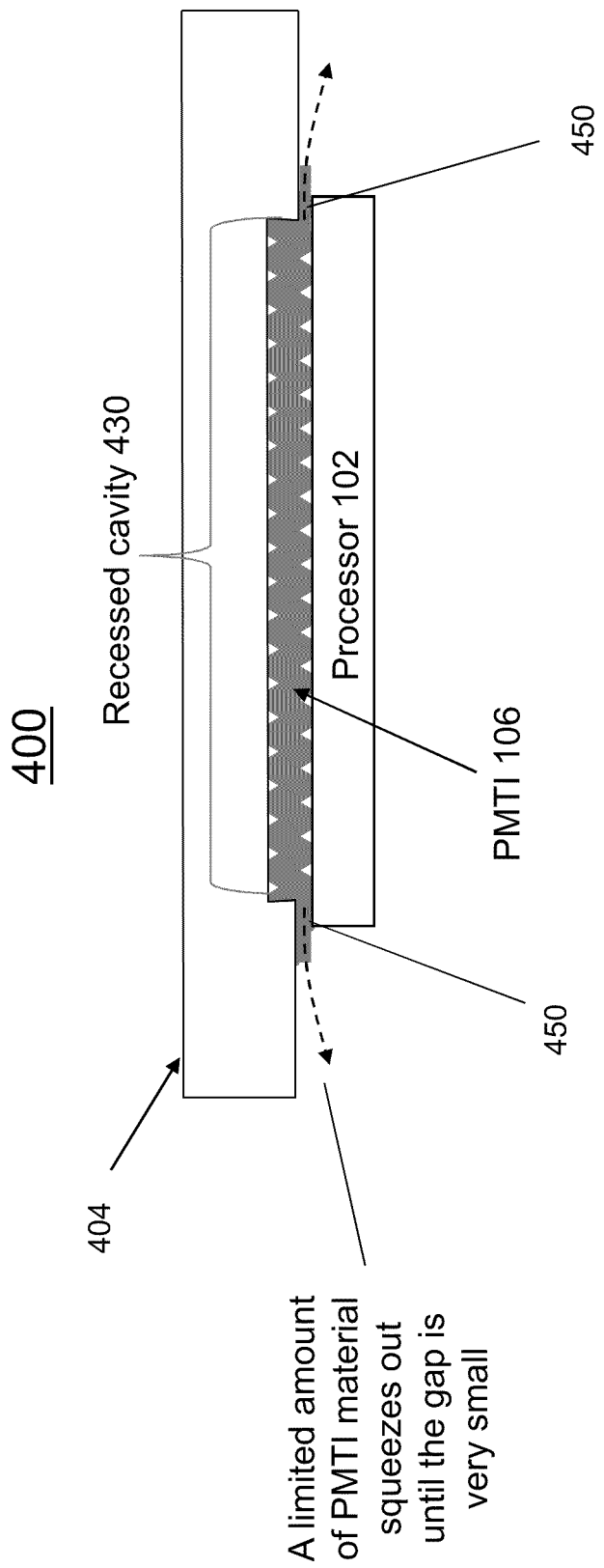
FIG. 4 shows another embodiment of the invention where the containment ring is an integral part of the heat sink.

According to an embodiment of the present invention, we discuss a method to suppress the squeezing out of PMTI material 106 by using a containment method, albeit a partial containment, but nonetheless, a very effective one. Providing a full containment in the form of a gasket is fairly ineffective for the following reasons: 1) the pressure exerted by the PMTI material on such a gasket over the various squeezing out cycles is increasing: 2) the pressure becomes larger than what a simple tight gasket (usually made out of organic material) can resist without losing much PMTI material; and 3) a hard metal gasket should not come into contact with the relatively fragile semiconductor processor. Therefore, we rely on a partial containment system, made out of a fairly hard material that is self-sealing and effectively minimizes the squeezing out of the PMTI material. FIGS. 3 and 4 illustrate two embodiments.

Referring now to FIG. 3 we illustrate a cross-section of a package 300 with a containment ring 370 according to an embodiment of the invention. A limited amount of PMTI material 106 squeezes out until the gaps 350 are small enough to restrict the further escape of PMTI material 106. The gaps 350 will become small enough, typically from 100 microns or more, to about 50 micron or less, at which time the squeezing out of material slows down exponentially. The ring 370 ensures two things: 1) enough PMTI material 106 stays between most of the chip 102 and the heat-sink 104, in order to provide the needed cushion (deformable and thermally conducting) between the chip 102 and heat-sink 104; and 2) the conductivity at the edges of the chip 102 is not degraded in comparison to the rest of the chip 102. With the ring 370, the pressure is greatest at the edges of the chip 102 which helps preserve a good thermal conduction there.

The ring 370 acts as a partial containment system. The ring 370 is made out of a hard material (such as stainless steel, or nickel, or copper) and has a thickness typically between 50 and 150 microns. It overlaps partially over the semiconductor chip 102 by typically less than 1 mm. A few locating fixtures 312 to secure the ring 370 can be either part of the ring 370 or part of the heat-sink 104. The locating fixtures 312, keep the ring 370 in position and prevent the ring 370 from sliding in the horizontal plane (left-right, or backward-forward). The types of locating fixtures 312 and the number of fixtures 312 used are not important; they can be part of the heat-sink 104, such as machined posts, or some additional inserted plastic fixtures.

By itself, the ring 370 restrains some of the outward flow of PMTI material 106. As some material 106 is squeezed out, the gaps 350 close to the point where additional flow of the—viscous—PMTI material 106 becomes negligible. Hence, the gaps 350 become self-sealing. The ring 370 can also be bonded (welded, soldered, or epoxied) to one of the two surfaces, preferably the heat-sink 104, to locate the ring 370 more permanently.

FIG. 4 (also shown in cross-section) shows another embodiment 400 of the invention; wherein the ring 370 of FIG. 3 is integrated (embossed) into the heat-spreading lid 404 as an integral part of the heat-spreading lid 404. The heat-spreading lid 404 has a recessed cavity 430, and the edges of the cavity 430 act as a containment ring. The cavity 430 can be made by various fabrication techniques, including embossing, or machining (milling). The cavity 430 is between 10 and 1,000 microns deep. Presently, many computer processor packages include a heat-spreading lid between the processor and the heat-sink. In these cases, our solution also applies for a patterned indium interface between the processor and the heat-spreading lid.

The embodiment of FIG. 4 has a few advantages with respect to the previous embodiment (of FIG. 3): only one small gap 450 at the perimeter of the semiconductor 102; and a good thermal path at the perimeter of the semiconductor 102, with only one interface between the chip 102 and heat-sink 404 at the edges of the chip 102. In this embodiment, the closer proximity of the heat-spreading lid and the additional pressure on the PMTI material 106 contributes to an enhanced conductivity between the perimeter of the semiconductor 102 and the heat-spreading lid.

Therefore, while there has been described what is presently considered to be the preferred embodiment, it will understood by those skilled in the art that other modifications can be made within the spirit of the invention. The above descriptions of embodiments are not intended to be exhaustive or limiting in scope. The embodiments, as described, were chosen in order to explain the principles of the invention, show its practical application, and enable those with ordinary skill in the art to understand how to make and use the invention. It should be understood that the invention is not limited to the embodiments described above, but rather should be interpreted within the full meaning and scope of the appended claims.

We claim:

1. A method to improve reliability of a thermal coupling between a heat source and a heat sink, said method comprising:
   providing a self-sealing malleable conducting material between a first substantially flat surface of the heat source and a first substantially flat surface of the heat sink;
   providing a partial containment of the malleable conducting material to impede the malleable conducting material from being squeezed out of its location under a compressive load;
   providing a gap between the partial containment and the first substantially flat surface of the heat source to allow a limited amount of the malleable conducting material to squeeze out, such that the gap is narrowed by the limited amount of squeezed out malleable conducting material;
   wherein the gap eventually closes due to the limited amount of malleable conducting material squeezing out over time; and
   coupling the first substantially flat surface of the heat source to the first substantially flat surface of the heat sink.

2. The method of claim 1 wherein providing the partial containment comprises forming a retaining ring between the heat sink and the heat source.

3. The method of claim 1, wherein providing the partial containment comprises forming a shallow cavity in the heat sink such that a peripheral gap between the heat source and the heat sink is reduced during and after assembly under pressure.

4. The method of claim 2, where the heat sink surface comprises a patterned surface.

5. The method of claim 4, wherein the patterned surface comprises channels to evenly distribute the malleable thermal interface material under the compressive load.

6. The method of claim 2, wherein the partial containment overlaps the heat source by a small amount, between one percent and ten percent of a lateral dimension of the heat source.

7. The method of claim 2 further comprising affixing at least one locating fixture next to the retaining ring to constrain movement of said retaining ring in a horizontal plane.

8. The method of claim 7 wherein affixing the at least one locating fixture comprises affixing the locating fixture to the retaining ring.

9. The method of claim 7 wherein affixing the at least one locating fixture comprises affixing the at least one locating fixture to the heat sink.

10. The method of claim 1 further comprising providing a lubricating surface between the heat source and the malleable conducting material.

11. A cooling assembly, comprising:
    a heat sink with one substantially flat surface;
    a self-sealing malleable conducting material disposed between the one substantially flat surface of the heat sink and a substantially flat surface of a heat source;
    a heat spreader lid;
    a partial containment of the malleable conducting material to impede the malleable conducting material from being inched-out of its location under a compressive load; and
    a gap between the partial containment and the substantially flat surface of the heat source to allow a limited amount of the malleable conducting material to squeeze out, such that the gap is narrowed by the limited amount of squeezed out malleable conducting material;
    wherein the gap eventually closes due to the limited amount of malleable conducting material squeezing out over time.

12. The assembly of claim 11 wherein the partial containment comprises a retaining ring between the heat sink and the heat source.

13. The assembly of claim 11 wherein the partial containment comprises a shallow cavity in the heat sink.

14. The assembly of claim 12 where the retaining ring is bonded to the heat sink.

15. The assembly of claim 11, wherein the heat-sink comprises other patterning features.

16. The assembly of claim 11, wherein the malleable conducting material comprises at least one of Indium, Tin, bismuth, antimony, thallium, gallium Silver, Gold, Platinum, Lead, Aluminum, Titanium, Tantalum, Tungsten, Chromium, Nickel, wax, or grease.

17. The assembly of claim 11, wherein the malleable conducting material further optimizes the contact between the heat source and heat sink surfaces by applying a thin layer of a malleable polymer coating on the heat sink and heat source.

18. The assembly of claim 11 further comprising the heat source.

19. The assembly of claim 11 wherein the partial containment comprises a shallow cavity in the heat spreader lid.

* * * * *